United States Patent
Child et al.

(10) Patent No.: US 10,411,152 B2
(45) Date of Patent: Sep. 10, 2019

(54) SOLAR CELL BONDING

(71) Applicant: Merlin Solar Technologies, Inc., San Jose, CA (US)

(72) Inventors: Kent Riley Child, Dublin, CA (US);
Jesse Dam, Union City, CA (US);
Arthur Rudin, Morgan Hill, CA (US);
Gopal Prabhu, San Jose, CA (US);
Venkatesan Murali, San Jose, CA (US)

(73) Assignee: Merlin Solar Technologies, Inc., San Jose, CA (US)

( * ) Notice: Subject to any disclaimer, the term of this patent is extended or adjusted under 35 U.S.C. 154(b) by 143 days.

(21) Appl. No.: 15/627,890

(22) Filed: Jun. 20, 2017

(65) Prior Publication Data
US 2017/0373217 A1     Dec. 28, 2017

Related U.S. Application Data

(60) Provisional application No. 62/354,976, filed on Jun. 27, 2016.

(51) Int. Cl.
*B32B 37/00* (2006.01)
*H01L 31/18* (2006.01)
*H01L 31/0224* (2006.01)

(52) U.S. Cl.
CPC .. *H01L 31/1876* (2013.01); *H01L 31/022433* (2013.01); *H01L 31/188* (2013.01); *Y02E 10/50* (2013.01); *Y02P 70/521* (2015.11)

(58) Field of Classification Search
CPC .............. H01L 31/18; H01L 31/1876; H01L 31/022433; H01L 31/188; B29C 65/02; B23K 20/00

USPC ................................. 156/498, 583.1, 583.4
See application file for complete search history.

(56) References Cited

U.S. PATENT DOCUMENTS

| | | | |
|---|---|---|---|
| 4,909,429 A | 3/1990 | Ankrom et al. |
| 7,828,031 B2 | 11/2010 | Micciche |
| 8,138,413 B2 | 3/2012 | Luch et al. |
| 8,328,077 B1 | 12/2012 | Willie et al. |

(Continued)

FOREIGN PATENT DOCUMENTS

| | | |
|---|---|---|
| DE | 10210521 A1 | 9/2003 |
| WO | 2016210187 A1 | 12/2016 |

OTHER PUBLICATIONS

International Search Report dated Apr. 5, 2018 for PCT Patent Application No. PCT/US2017/067608.

*Primary Examiner* — James D Sells
(74) *Attorney, Agent, or Firm* — MLO, a professional corp.

(57) ABSTRACT

A bonding apparatus includes a heat source, a first plate, a second plate, and an actuation mechanism. The first plate is coupled to the heat source. The first and second plates are thermally conductive and configured to cover an entire solar cell. The actuation mechanism moves the bonding apparatus between an open position and a closed position. In the closed position, the first plate and the second plate contact opposite surfaces of the solar cell. The second plate is configured to dissipate heat such that the second plate has a lower temperature than the first plate when in the closed position. The first plate and the second plate apply a force to the solar cell, the force at a first end of the solar cell being different than at a second end of the solar cell when the bonding apparatus is in or moving to the closed position.

24 Claims, 13 Drawing Sheets

(56) References Cited

U.S. PATENT DOCUMENTS

| | | |
|---|---|---|
| 2008/0153258 A1 | 6/2008 | Thallner |
| 2011/0253191 A1 | 10/2011 | Kutzer et al. |
| 2011/0271996 A1 | 11/2011 | Hahn et al. |
| 2013/0048047 A1 | 2/2013 | Fujii et al. |
| 2016/0211238 A1 | 7/2016 | Dhavaleswarapu et al. |
| 2016/0268325 A1 | 9/2016 | Hsieh et al. |
| 2016/0380128 A1* | 12/2016 | Sewell ............ H01L 31/022425 438/98 |

* cited by examiner

SOLAR CELL BONDING

RELATED APPLICATIONS

This application claims priority to U.S. Provisional Patent Application No. 62/354,976, filed on Jun. 27, 2016 and entitled "Solar Cell Bonding," which is hereby incorporated by reference for all purposes.

BACKGROUND

A solar cell is a device that converts photons into electrical energy. The electrical energy produced by the cell is collected through electrical contacts coupled to the semiconductor material, and is routed through interconnections with other photovoltaic cells in a module. Solar cell metallization is most commonly achieved by screen printing a silver paste onto the cell and then soldering ribbons across the screen-printed bus bars. The ribbons are used to string—that is, electrically interconnect—multiple solar cells together in serial fashion for a solar module. Ribbons are also referred to as tabbing ribbon, interconnect wires, photovoltaic wires, or other similar terms.

Another type of solar cell metallization is disclosed in U.S. Pat. No. 8,916,038 "Free-Standing Metallic Article for Semiconductors" and U.S. Pat. No. 8,936,709 "Adaptable Free-Standing Metallic Article for Semiconductors," in which a unitary metallic article is used to collect electric current from the light-incident surface of the solar cell as well as to interconnect cells together. To connect the solar cells together in an array, each metallic article on a front surface of a cell is electrically coupled to a metallic article on a back surface of the neighboring cell using a cell-to-cell interconnect that may be part of one of the metallic articles.

As renewable energy continues to be an important area for supplying energy needs for an ever-increasing population, there is a need for improving cost and manufacturing efficiency of solar cells.

SUMMARY

In some embodiments, a bonding apparatus comprises a heat source, a first plate, a second plate, and an actuation mechanism. The first plate is coupled to the heat source. The first plate and the second plate are each thermally conductive and configured to cover the entire solar cell. The actuation mechanism is configured to move the bonding apparatus between an open position and a closed position. In the open position, the first plate and the second plate are apart, and in the closed position, the first plate and the second plate contact opposite surfaces of the solar cell. The second plate is configured to dissipate heat such that the second plate has a lower temperature than the first plate when the bonding apparatus is in the closed position. The first plate and the second plate are configured to apply a force to the solar cell. The force at a first end of the solar cell is different than the force at a second end of the solar cell when the bonding apparatus is in or moving to the closed position.

In some embodiments, a bonding apparatus comprises a heat source, a first plate, a second plate, and an actuation mechanism. The first plate is coupled to the heat source. The first plate and the second plate are each thermally conductive and configured to cover the entire solar cell. The actuation mechanism is configured to move the bonding apparatus between an open position and a closed position. In the open position, the first plate and the second plate are apart, and in the closed position, the first plate and the second plate contact opposite surfaces of the solar cell. The first plate and the second plate are configured to operate at different temperatures from each other when in the closed position. The first plate and the second plate are configured to apply a force to the solar cell. The force at a first end of the solar cell is different than the force at a second end of the solar cell when the bonding apparatus is in or moving to the closed position.

In some embodiments, a bonding apparatus comprises a heat source, a first plate, a second plate, and an actuation mechanism. The first plate is coupled to the heat source. The first plate and the second plate are each thermally conductive and configured to cover the entire solar cell. The actuation mechanism is configured to move the bonding apparatus between an open position and a closed position. In the open position, the first plate and the second plate are apart, and in the closed position, the first plate and the second plate contact opposite surfaces of the solar cell. The second plate is configured to dissipate heat such that the second plate has a lower temperature than the first plate when the first plate is in the closed position. The first plate and the second plate are configured to apply a higher force at a first end of the solar cell than at a second end of the solar cell when the bonding apparatus is in or moving to the closed position.

DETAILED DESCRIPTION

In the solar industry, the conventional method of electrically connecting solar cells is to solder conductive metallic ribbons or wires made of solder-coated copper onto silver deposited pads located both on the front and back of the cells. The ribbons collect electrical current from the surface of the solar cell and serve as a conduit for the solar cells in a module so that the energy from the solar module can be utilized. The process of attaching ribbons or wires can be very complex, costly and time consuming, and is accomplished in a serial fashion; that is, first on one side (front or back) of the solar cell and then on the opposite side.

The conventional bonding process starts by introducing the solder-coated ribbon onto the cell's top or bottom silver pads and soldering the ribbon in a sweeping side to side action (e.g., lengthwise or widthwise with respect to the solar cell). The process is then repeated for the reverse side of the cell. Current processes use hot air soldering, individual soldering irons that physically touch the ribbons, or focused infrared light. All these methods are time consuming, costly and intrinsically harsh on the fragile solar cell. The harshness is due to either point impact damage or thermal expansion non-uniformities. Both of these issues cause cracking and/or breakage of the cell. These issues are exacerbated due to having to repeat the process twice in the serial process of bonding one side of the cell and then the other. The conventional methods are also costly to upgrade. For example, if the industry moves to more and more attach ribbons (or wires), the standard equipment needs to have costly and time consuming machine upgrades to expand the number of ribbons. Conventional methods also are not flexible to changing cell sizes or cut cell variations. The equipment has to be converted for every cell change permutation, which results in manufacturing down time as well as equipment costs.

The present disclosure describes a single cycle bonding or soldering of both the front and back metallization elements of a solar cell at the same time. The front metallization element is on the light-incident surface of the photovoltaic cell. The metallization can be, for example, conventional ribbons or wires, or other types of metallic grids or articles that are used to collect electrical current from a solar cell and to interconnect cells. The present methods and systems allow for a wide range of metallization types—such as sizes, shapes and quantities—to be bonded to various types of cut cell shapes with one tool. Thus, large or small area array gang bonding on any solar cell can be achieved without costly tool upgrades or downtime.

Figure 1:
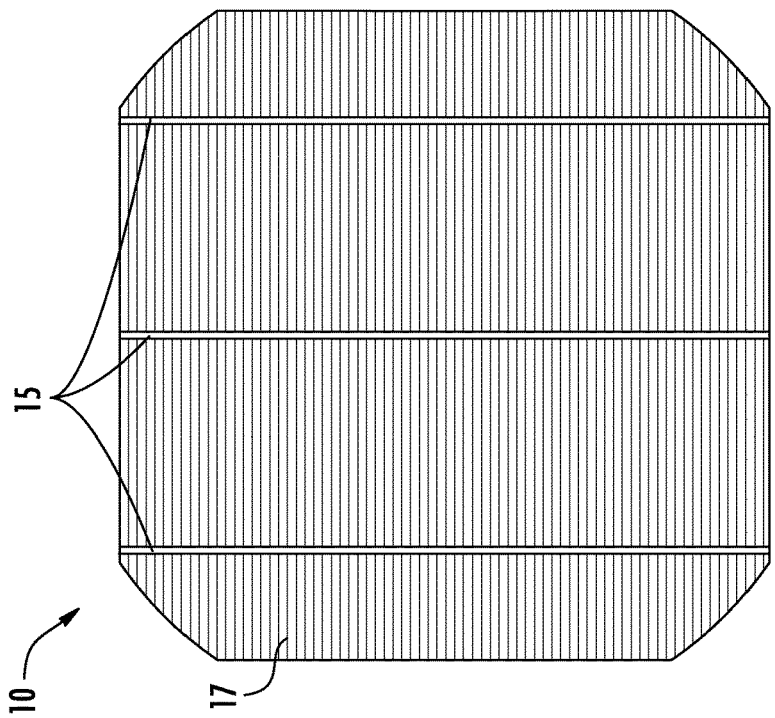
FIG. 1 is a top view of a conventional solar cell with ribbon metallization.

FIG. 1 shows a conventional solar cell 10 with ribbon metallization. The solar cell 10, illustrated as a monocrystalline cell, has three ribbons 15 soldered to the surface of the cell 10. The surface of cell 10 has silver fingers 17 which serve as conduits for electrical current generated by the cell, where the ribbons 15 collect the energy from the fingers. When used in an array of cells for a solar module, the ribbons 15 extend past an edge of the cell to allow interconnection of cells, typically to the back side of the next cell for a series connection. The back side (not shown) of the conventional cell 10 typically has discrete silver pads to which the ribbons are soldered. In most tabber-stringer operations, the ribbons 15 are laid onto and soldered to the front surface of the cell 10, and then in a subsequent manufacturing step, the ribbons are soldered to the back side of the neighboring cell in the string.

Figure 2:
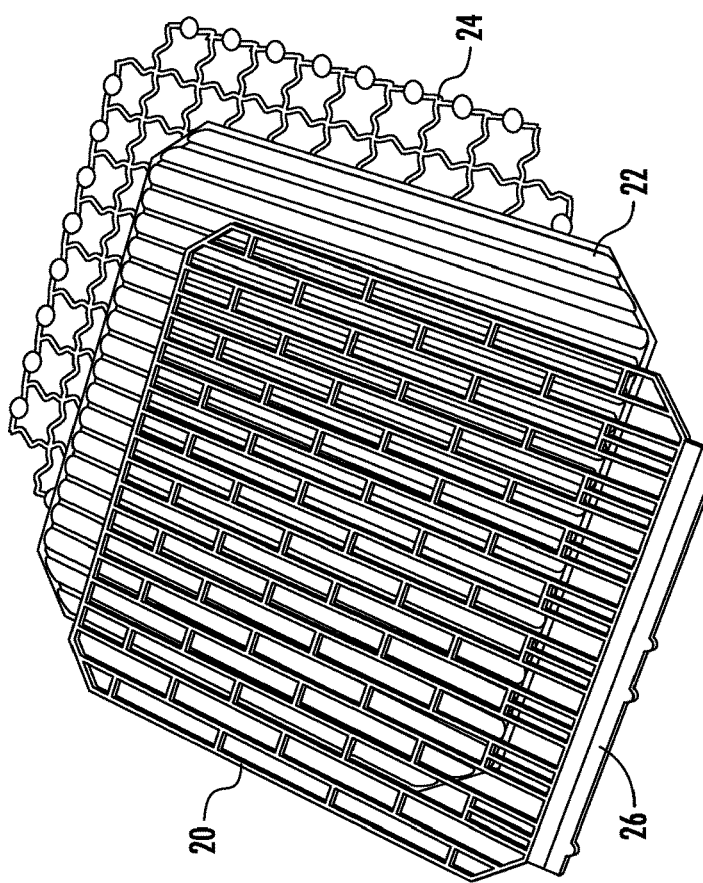
FIG. 2 is a perspective view of unitary metallic articles utilized for metallization of a solar cell, as known in prior art.

FIG. 2 shows another type of metallization, such as disclosed in U.S. Pat. Nos. 8,916,038 and 8,936,709 which are both hereby incorporated by reference, where a unitary metallic article provides the metallization for an entire surface of a solar cell. In FIG. 2, a front metallic article 20, a semiconductor wafer 22, and a back metallic article 24 are shown. Front metallic article 20 will be mounted on the light-incident surface of the wafer 22, while back metallic article 24 will be mounted to the back surface of wafer 22. An interconnection element 26 of front metallic article 20 will be electrically coupled to the back metallic article 24 of an adjacent cell in a solar module.

In the present disclosure, an apparatus is provided that can bond the metallization to both the front and back surfaces of a solar cell simultaneously. The system aligns both the front and back metallization elements to the silver attachment pads of the solar cell and then attaches the stack together—that is, the front metallization, wafer, and back metallization—in a single heat and pressure step. The applied heat can be induction, radiant, resistive, hot air or other heat source. The heat can be applied to only one side of the solar cell, such as the top, or to the top and bottom simultaneously. Pressure can be applied, such as by mechanical or pneumatic means. The system is configured to spread the heat evenly in a controlled pressing action applied across the photovoltaic cell, from one edge to another edge. This non-uniform pressing action can be achieved, for example, by non-parallel plates, differentiated spring forces, or a foam block of varying density. This results in a differential force—that is, an amount of applied force that is different at one end of the photovoltaic cell compared to the opposite end.

The present embodiments also decouple the needed higher heat for the front attach and lower heat for the back attach to protect the fragile back silver pads, while still applying enough heat and pressure to attach the back. This is all accomplished in one heat, pressure and time step. By completing the front and back attachments of the metallizations in one step, thermal mismatch in all materials are controlled. This removes a source of cracking that occurs during manufacture of solar cells. The present embodiments also remove the hazard of moving the cell through several steps by combining all steps into one. Due to the nature of one large thermal press (that includes presses for the entire front surface and for the back), the likelihood of point source cracking is also reduced.

Figure 3:
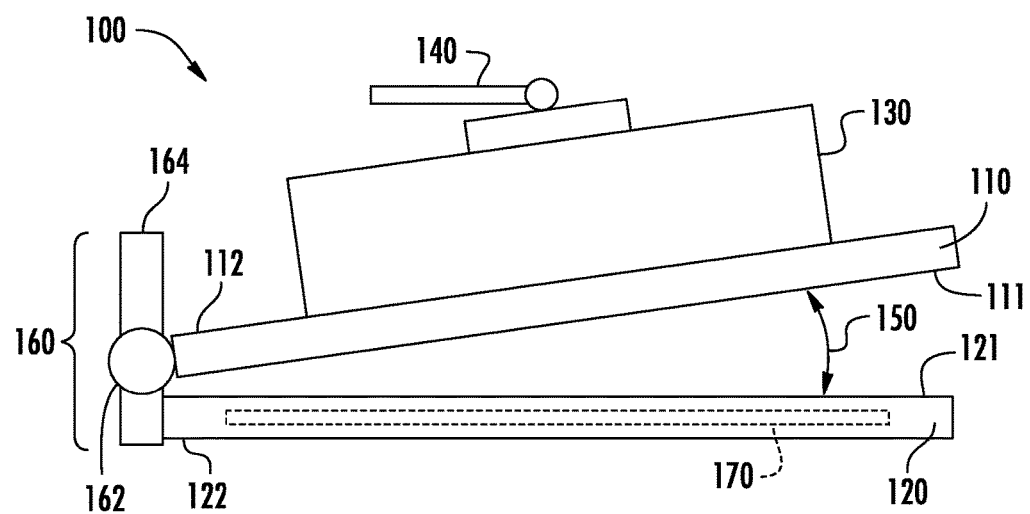
FIG. 3 is a schematic of a side view of a solar cell bonding apparatus, in accordance with some embodiments.

FIG. 3 shows a simplified, side view schematic of a solar cell bonding apparatus 100 in accordance with some embodiments. The apparatus 100 includes a first plate 110, a second plate 120, and a heat source 130 that is coupled to the first plate 110. First plate 110 and second plate 120 are made of a thermally conductive material to enable heat transfer to the solar cell components, to melt a bonding material such as solder and attach the components together. The thermally conductive material for the first and second plates 110 and 120 can be, for example, copper, aluminum, gold, brass, bronze, or quartz. An actuation mechanism, illustrated as a lever 140 in this embodiment, is used to open and close the apparatus 100 as indicated by arrow 150. The apparatus 100 is shown in an open position such that solar cell components may be inserted between first plate 110 and second plate 120 for bonding. After the components to be bonded have been loaded, the actuation mechanism 140 is used to move the first plate 110 and second plate 120 together to a closed position, where the contacting surface 111 of first plate 110 and the contacting surface 121 of second plate 120 contact and apply pressure to opposite surfaces of the cell components. In some embodiments, the first plate 110 is moved by the actuation mechanism 140 while the second plate 120 remains stationary. In other embodiments, both the first plate 110 and second plate 120 may be moved by the actuation mechanism 140, or by two separate actuation mechanisms.

Figure 4:
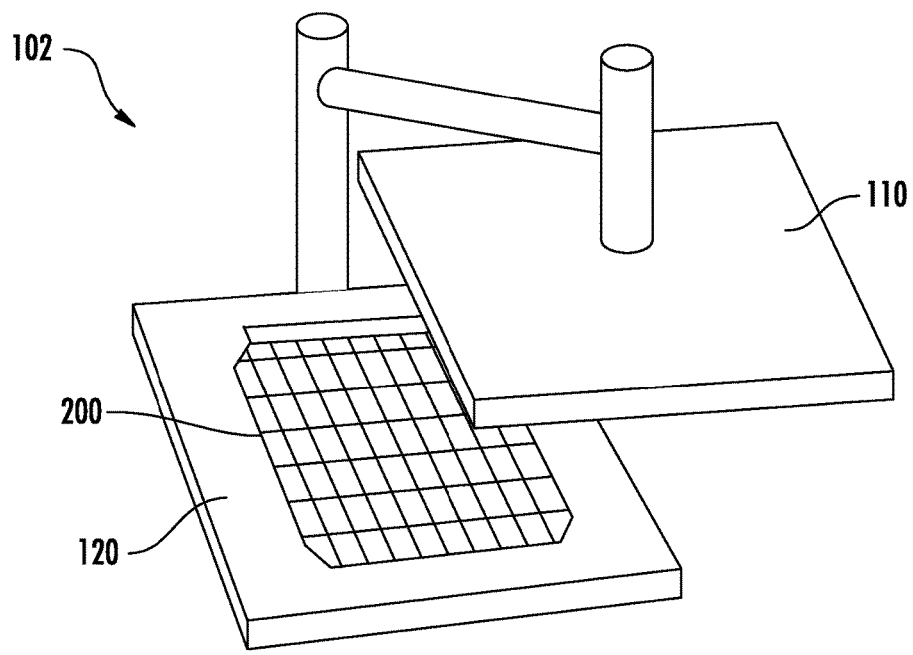
FIG. 4 is a front perspective view of an embodiment of a bonding apparatus, in accordance with some embodiments.

In the embodiment of FIG. 3, the first plate 110 and second plate 120 are hingedly coupled together by a joint 160 at an edge 112 of first plate 110 and at an edge 122 of second plate 120. Joint 160 includes a hinge 162 which aligns the first plate 110 in a non-parallel manner with respect to second plate 120 when moving the plates 110 and 120 between the open and closed positions. For example, the first plate 110 and the second plate 120 may be non-parallel to each other when the actuation mechanism moves the bonding apparatus from the open position to the closed position, the first plate being closer to the second plate near the first end of the solar cell. In other embodiments, the joint 160 can be used for aligning the first and second plates 110 and 120 parallel to each other. The joint 160 also includes a vertical rod 164 that can allow for vertical displacement of first plate 110 with respect to second plate 120. In some embodiments, the vertical rod 164 can also enable rotational movement about its longitudinal axis, which may facilitate loading and unloading of the solar cell components from the apparatus 100. For example, FIG. 4 is a plan view of a bonding apparatus 102, in an embodiment where first plate 110 and second plate 120 are laterally rotated and displaced from each other in the open position. Solar cell components 200 are illustrated within the bonding apparatus 102, in preparation for bonding when the solar cell 200 will be pressed between plates 110 and 120. The plates 110 and 120 can be raised and lowered vertically to move between the open and closed position, and can also include rotational joints (not shown in this embodiment) to angle the plates 110 and 120 to be non-parallel with each other.

Other types of mechanisms may be used to move the bonding apparatuses of the present disclosure between the open position and the closed position, such as but not limited to linkages, gears, linear slides, and pneumatic cylinders. Actuation mechanisms other than lever 140 can include, for example, electronic controls, push buttons, and pulleys.

Returning to FIG. 3, the heat source 130 may be any type of heat source such as resistive heat, infrared, hot air, or induction coils. The heat source can be chosen to accommodate the melt temperatures of the solder being used, such as heat sources with an operating temperature in the range of 25-500 C. In some embodiments, the heat source can have a rapid ramp time, such as less than one second to ramp to operating temperature. Although heat source 130 is shown to be mounted onto the first plate 110, in some embodiments the heat source 130 may be incorporated into the bonding apparatus 100 in any way appropriate to the type of heat source. For instance, for resistive heating, heating elements may be embedded within the first plate 110, with a control panel being located elsewhere—such as attached to or separate from—the illustrated bonding apparatus 100. In further embodiments, a second heat source 170 may be coupled to second plate 120, where the second heat source 170 may be the same or different type (e.g., resistive, infrared, etc.) than heat source 130. In the embodiment of FIG. 3, second heat source 170 is illustrated as being embedded within the second plate 120.

In various embodiments, the present bonding apparatuses can be designed to accommodate many configurations of cells and cell designs. For example, the surface areas of the first plate 110 and second plate 120 can be designed for any size cell, for various numbers of ribbons, and even to bond multiple cells at once. For example, the plates 110 and 120 may have a length and width to cover the largest anticipated cell to be bonded by the apparatus, such that smaller sizes of cells can also be accommodated by the same apparatus. In other embodiments, fixtures may be included to assist in aligning the metallization elements with the silver fingers/pads on the semiconductor wafer. The fixtures may be integral to the plates 110 and 120 or may be removable inserts.

Figure 5A:
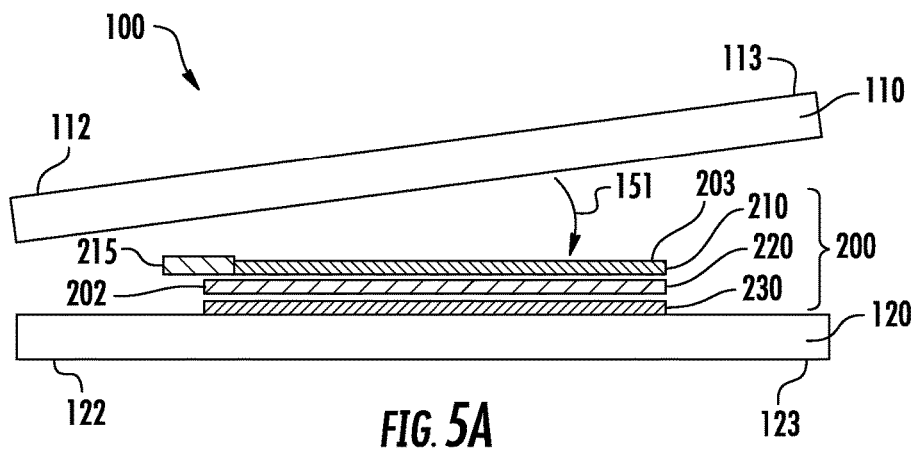
FIGS. 5A and 5B are schematic side views of a bonding apparatus in open and closed positions, respectively, in accordance with some embodiments.
Figure 5B:
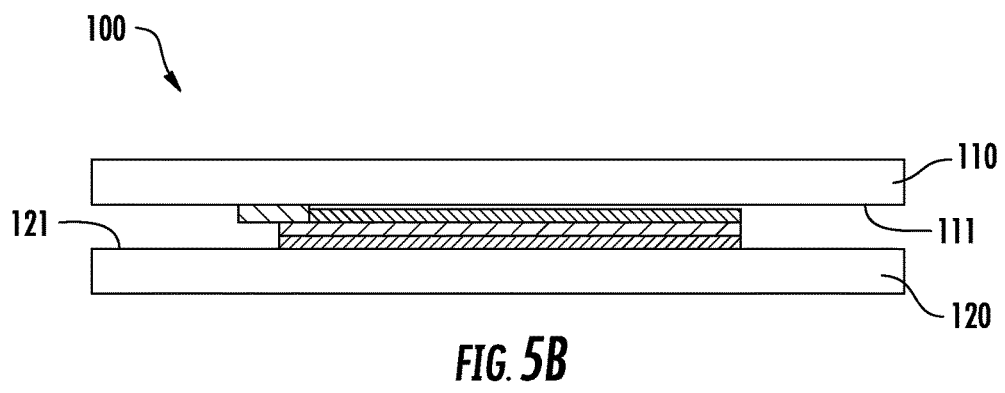

FIGS. 5A-5B are side views of bonding apparatus 100 in operation, showing only the first plate 110 and second plate 120 of the apparatus 100 for clarity. Components of a solar cell 200 have been loaded into the apparatus 100 for bonding, where the components include front metallization element 210, semiconductor wafer 220, and back metallization component 230. The front metallization element 210 in some embodiments include an interconnection element 215, which can have a thickness (vertical height in FIG. 5A) that is greater than the main portion of the front metallization element 210 that lies over the surface of the wafer 220. In other embodiments, interconnection element 215 may be absent. The front metallization element 210 and back metallization component 230 may be conventional ribbons as in FIG. 1 or grid-type articles as in FIG. 2. The metallization elements 210 and 230 may have solder pre-coated onto them, or solder may be applied in a secondary process prior to being inserted into the bonding apparatus 100.

In FIG. 5A the apparatus 100 is shown in an open position, where the first plate 110 and second plate 120 are apart such that the components of solar cell 200 may be loaded into the apparatus 100. To initiate the bonding process, the first plate 110 is heated, such as from heat source 130, prior to being moved to the closed position. As the first plate 110 is moved toward the solar cell 200 as indicated by arrow 151, heat from first plate 110 melts the solder on the front and back metallization elements 210 and 230. The first plate 110 is articulated toward the second plate 120, which can involve both angular motion and vertical displacement. Because the first plate 110 and second plate 120 are moved together at an angle, with edges 112 and 122 being closer together than the opposite edges 113 and 123 of the plates as the plates 110 and 120 are being moved to the closed position, molten solder flows from the thinner gap area between edges 112 and 122 to the thicker gap area between edges 113 and 123, resulting in equal reflow lengths. The angled configuration of the first plate 110 and the second plate 120 with respect to each other results in the application of a force to the solar cell 200, where the force applied to a first end 202 of solar cell 200 is different from the force applied to a second end 203 of the solar cell 200 when the bonding apparatus 100 is moving to the closed position. In this embodiment, the force is higher at the first end 202 of solar cell 200 than the second end 203. The non-parallel alignment of first plate 110 and second plate 120 as the plates are moved together also accommodates the increased height of interconnect element 215, again enabling solder to flow from a thicker area of the metallization to thinner areas as the solder flows across the solar cell surface.

In FIG. 5B the apparatus 100 is in a closed position, where the plates 110 and 120 are facing each other and are in direct contact with opposite surfaces of the solar cell 200. First contacting surface 111 of first plate 110 contacts the front surface of solar cell 200, and second contacting surface 121 of second plate 120 contacts the back surface. In the closed position, heat continues to be applied to the solar cell 200 to implement the bonding process. Heat flows from the heat source 130 through first plate 110, to solar cell 200, then to second plate 120. While the heating occurs, pressure is applied to solar cell 200 from the first plate 110 and second plate 120 to promote secure bonding and to prevent lift-off of the metallization elements due to thermal expansion.

Figure 6A:
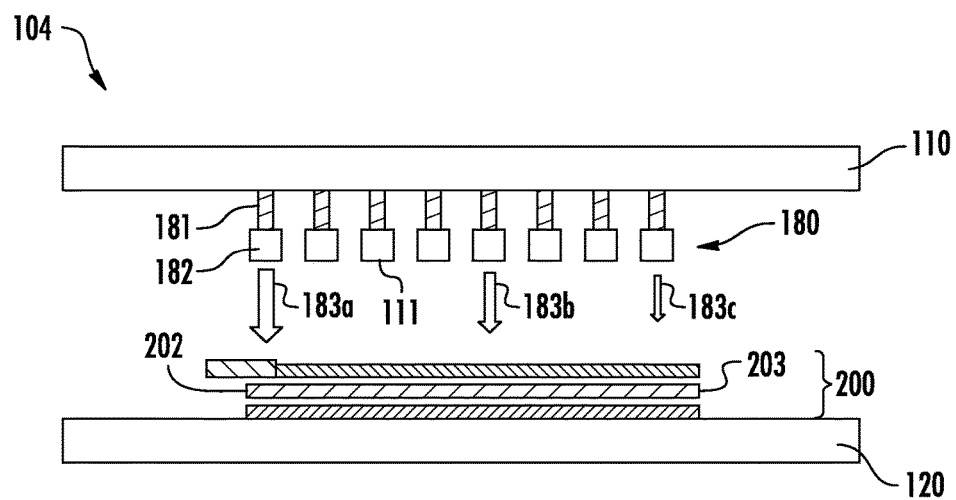
FIGS. 6A and 6B are schematic side views of further embodiments of bonding apparatuses, in accordance with some embodiments.
Figure 6B:
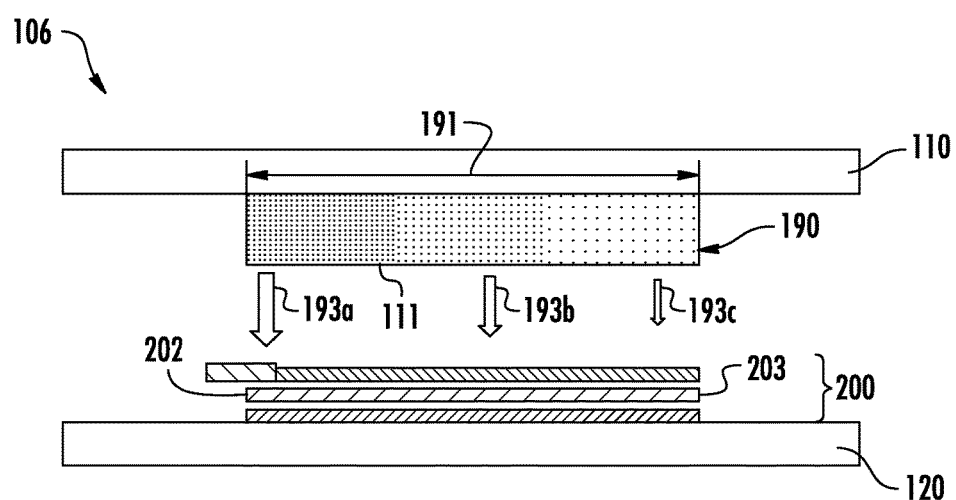

FIGS. 6A and 6B are simplified side views of further embodiments in which a differential force can be created by the bonding apparatus. For clarity, heating sources and actuation mechanisms that couple the first and second plates 110 and 120 together are not shown in FIGS. 6A-6B. In FIG. 6A, the first plate 110 of bonding apparatus 104 includes an array of biasing components 180, where the biasing components 180 are positioned across the surface area that will contact the solar cell 200 when in the closed position. Biasing components 180 are not necessarily drawn to scale, for clarity of the illustration. Each biasing component 180 in this embodiment includes a biasing element 181 coupled at one end to first plate 110, and a cap 182 coupled to the opposite end of biasing element 181. Biasing element 181 provides a biasing force and may be, for example, a compression spring or a compressible material such as foam. Cap 182—which may be omitted in some embodiments—improves the contacting surface of the solar cell 200, such as if the end of biasing element 181 is uneven, or does not provide sufficient contact area for contacting the solar cell. For example, cap 182 can be a cylindrical piece with a flat end face, where the diameter of the end face is greater than the diameter of biasing element 181. The biasing components 180 of FIG. 6A are illustrated as spring-loaded pins, as an example embodiment. Heat transfers from the first plate 110 through the biasing array 180 to the solar cell 200, such that the ends of the biasing components 180 that face the solar cell become the contacting surface 111 of the first plate 110. Possible materials for biasing element 181 and/or cap 182 include, but are not limited to, copper, ceramic, and quartz. Additional materials for caps 182 include, but are not limited to, polytetrafluoroethylene (PTFE), Vespel®, Torlon®, and polyether ether ketone (PEEK).

The biasing components 180 are configured to create a differential force across the solar cell 200 by being configured with varying biasing forces across the array. The non-uniform forces applied across the surface of the solar cell 200 assists in promoting solder reflow, as explained above in relation to the non-parallel plates. For example, a decreasing force across the surface can assist the solder in flowing from the end with a higher force to the other end with a lower force, resulting in a more uniform solder thickness. In the embodiment of FIG. 6A, the first biasing force 183a of a first biasing element near the first end 202 of solar cell 200 is greater than the second biasing force 183c of a second biasing element near the second end 203 of the solar cell 200, as indicated by the size of the arrows. An intermediate biasing element has a third biasing force 183b that has a value between the biasing forces 183a and 183c. In some embodiments, the difference in biasing force may be expressed as a pressure, for example, approximately 0.010-0.020 lbs/in² differential from one end of the plate to the other, such as 0.015 lbs/in² differential. In some embodiments, the spring-loaded pins may have variable spacing across the surface, in addition to or instead of having spring forces that are different from each other. For example, a wider spacing between pins in one region will result in less applied force on the solar cell than pins that are spaced closer together in another region. This configuration of having biasing forces that vary across the array 180, such as a first biasing force that is higher than a second biasing force of a second biasing element, results in a varying force across the solar cell 200 without requiring the plates 110 and 120 to be non-parallel to each other when moving to the closed position. Thus, the varying force may be applied to the solar cell when the bonding apparatus is in the closed position rather than when moving the bonding apparatus to the closed position as with non-parallel plates. In embodiments with a plurality of biasing components 180, the first and second plates 110 and 120 may be moved toward each other in a parallel fashion, or they may be angled with respect to each other. Note that although the force components have been described as incorporated into first plate 110, in other embodiments the force components can be incorporated into second plate 120 or into both the first plate 110 and the second plate 120.

FIG. 6B shows an embodiment of another bonding system 106 in which the heating plate 110 includes a compressible block 190 to create a differential force across the solar cell 200. Compressible block 190 may be, for example, a foam material such as ceramic, quartz, PTFE, Vespel, Torlon, and PEEK. The foam may be covered with a non-stick coating or sheet such as a fluoropolymer, to help prevent the solar cell from adhering to the heating plate 110. Compressible block 190 has a density gradient across a length 191, in a direction extending between the first end 202 and the second end 203 of solar cell 200. The density gradient causes the compressible block 190 to apply a differential force across solar cell. Similar to the array of biasing components 180 in FIG. 6A, the compressible block 190 has a force 193a near first end 202 of solar cell 200, a lesser force 193b in an intermediate region of block 190, and the least force 193c near the second end 203 of solar cell 200. The differences in biasing forces is created by density gradient across the block 190, where the block 190 has a first density corresponding to force 193a that is higher than a second density corresponding to force 193c. The density gradient may occur in a stepwise manner, or in a continuous manner. The density gradient may cause a pressure difference between one end of the plate the other end of, for example, approximately 0.010-0.020 lbs/in², such as 0.015 lbs/in² differential.

In any of the above embodiments, the plates 110 and 120 can be held in the closed position using various mechanisms such as, but not limited to, clamps, an enclosing frame structure, or actuators that can be mechanically, pneumatically or hydraulically operated.

In addition to applying pressure to the solar cell, both first plate 110 and second plate 120 are designed to apply uniform heating over the surface of the solar cell. Operating at an approximately uniform temperature prevents thermal stresses from developing across the surface of the solar cell 200. In some embodiments, the first plate has a first uniform temperature that is different than a second uniform temperature of the second plate. That is, the first plate and the second plate may be configured to operate at different temperatures from each other when in the closed position. Although various embodiments in this disclosure shall be described with the first plate operating at a higher temperature than the second plate, other embodiments may utilize the first plate operating at a lower temperature than the second plate, such as if the front metallization of the solar cell is placed into the bonding assembly facing the second (bottom) plate.

In some embodiments, the second plate 120 is configured to operate at a lower temperature than the temperature of the first plate 110. For example, the first and second plates may both have heat sources, where the heaters operate at different temperatures from each other to achieve different soldering temperatures on the side of the solar cell that the plate is contacting. In another example, the first plate 110 may have a heat source while the second plate 120 does not. In such an embodiment where the second plate 120 does not have its own heat source, the second plate may be configured to dissipate heat such that the second plate 120 operates at a lower temperature than the first plate 110 (which is actively heated by the heat source 130) during the heating process. In this manner, the soldering temperature of the back metallization element 230 can be controlled to accommodate differing solder requirements from the front side. High quality silver is typically used on the front side of solar cells, while lower-cost silver mixtures are typically used on the back side. The present bonding apparatus enables heat to be applied simultaneously to the front and back sides of the solar cell, but at different temperatures appropriate to each side. Furthermore, because thermal stresses in the solar cell are mitigated, higher temperature solders can be used, such as with temperatures of 250-350 C. Because of the wide range of temperatures that can be accommodated by the bonding apparatus, various types of solders can be used such as, for example, lead-tin of various ratios, polymers, or tin.

Figure 7:
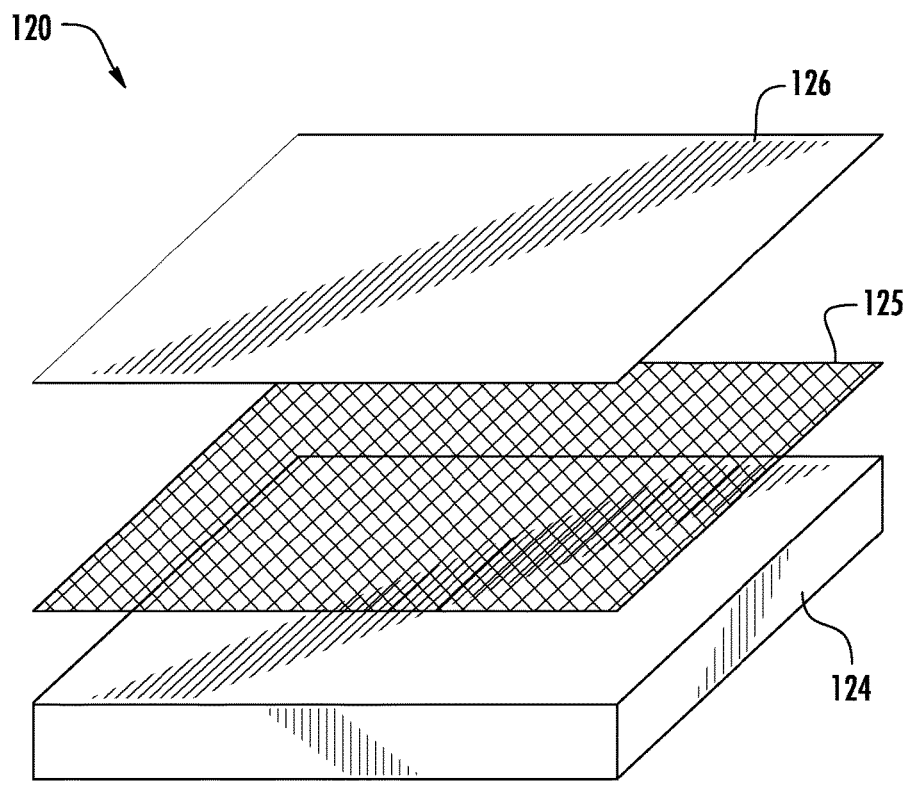
FIG. 7 is an exploded assembly view of an embodiment of a plate of a bonding assembly, in accordance with some embodiments.

FIG. 7 shows an exploded assembly view of an embodiment of the second plate 120, to achieve a uniform but lower operating temperature than the first plate 110. The second plate 120 in this embodiment includes three layers stacked together, a substrate 124, a mesh 125 and a thermally conductive sheet 126. The thermally conductive sheet 126 is shown in FIG. 7 as a solid sheet of material, such as a metal. The second plate 120 is placed with the thermally conductive sheet 126 being oriented toward to the solar cell. The sheet 126 has a high thermal conductivity to achieve a uniform temperature across the surface of the solar cell. Mesh 125 provides a thermal break to dissipate heat and results in a lower operating temperature of second plate 120 compared to first plate 110, while still being thermally conductive to maintain the uniform temperature. Substrate 124 is a thermally insulating material to control and maintain the effective temperature that is presented to the solar cell by sheet 126. In one embodiment, for example, the substrate 124 is silicone rubber, the mesh 125 is copper, and the sheet 126 is titanium. Mesh 125 may be a screen or lattice-type configuration, or any other intersecting or non-intersecting design, such as with linear and/or curved elements.

Figure 8:
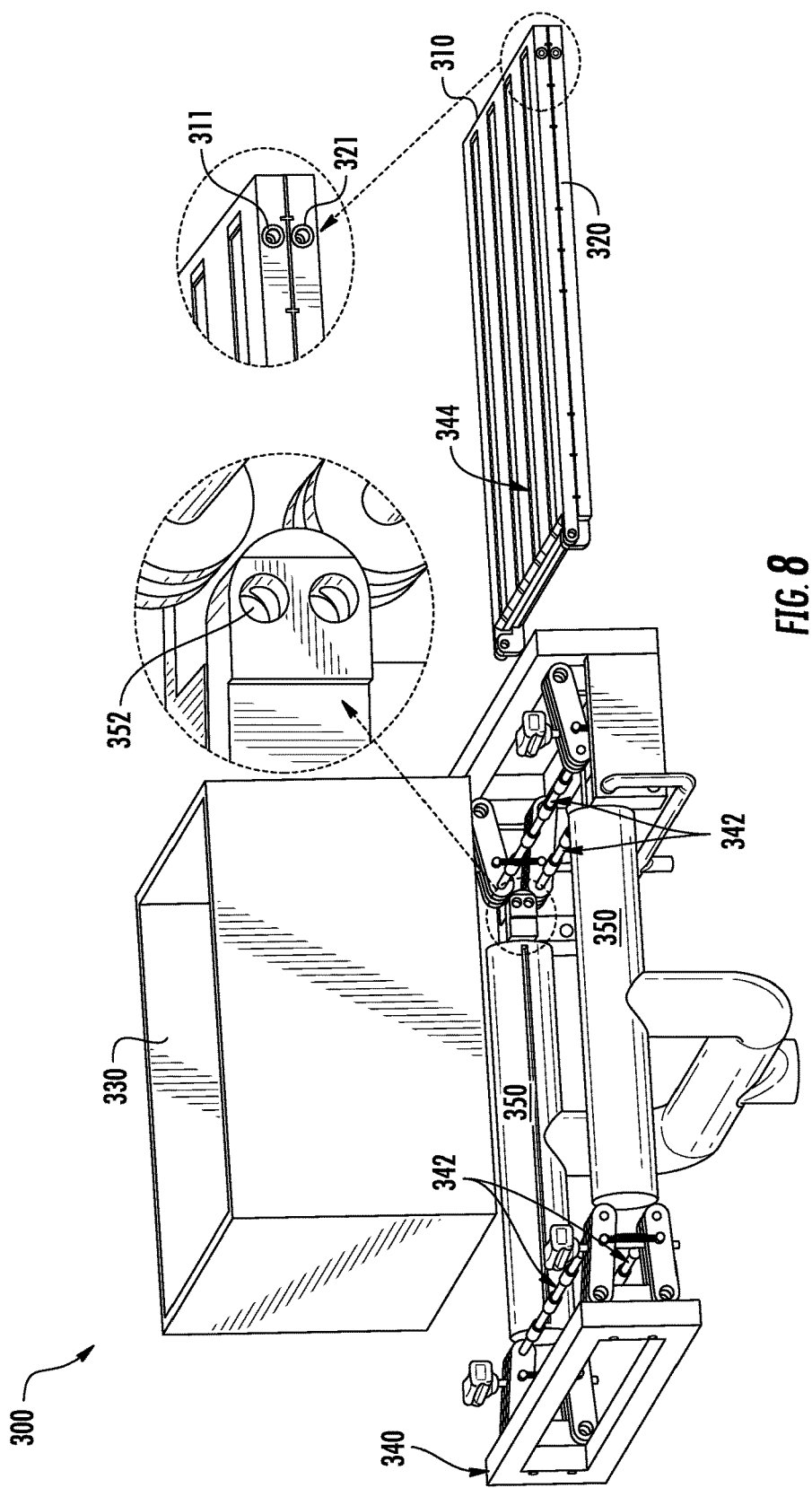
FIG. 8 is a perspective view of another embodiment of a bonding apparatus that includes a pinch roller system and gas flow.

FIG. 8 is a perspective view of another embodiment of a bonding apparatus, in which gas flow is utilized in the heating system and a pinch roller system is used in the actuation mechanism. Bonding apparatus 300 includes a first plate 310, a second plate 320 and a heat source 330. Heat source 330 may be, for example, a lamp assembly. In other embodiments, the heat source 330 may be incorporated into the first plate 310 and/or second plate 320, as illustrated previously in FIG. 3. Bonding apparatus 300 also includes an actuation mechanism 340, embodied as a frame structure that has top and bottom pinch rollers 342 at both ends of the structure. The first and second plates 310 and 320 have pinch roller guides 344 on their outer surfaces, where the guides 344 are parallel grooves into which the pinch rollers 342 may travel. Also shown in FIG. 8 are O-ring seals 311 and 321 in first plate 310 and second plate 320 respectively, and exhaust conduits 350 and slide seals 352, all of which shall be described in more detail below.

Figure 9:
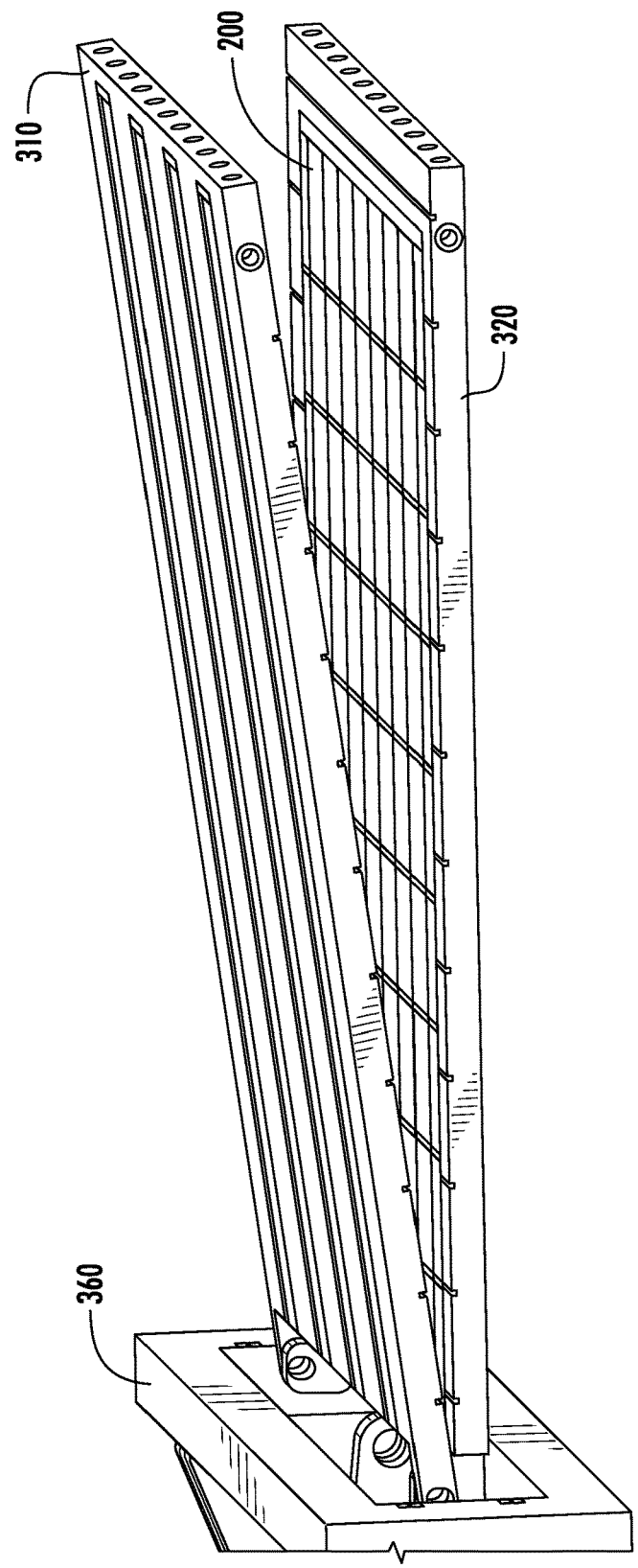
FIG. 9 is a side perspective view of heating plates of the bonding apparatus of FIG. 8. in accordance with some embodiments.

FIG. 9 shows the first plate 310 and second plate 320 in an open position, with solar cell 200 loaded into the space between the plates. The plates 310 and 320 are coupled together with a spring-loaded joint 360. The joint 360 is embodied here as a clamshell joint. Other embodiments include, for example, a vertical pneumatic lift (dis-jointed), or a multi-joint hinge (non-uniform disjoint).

Figure 10A:
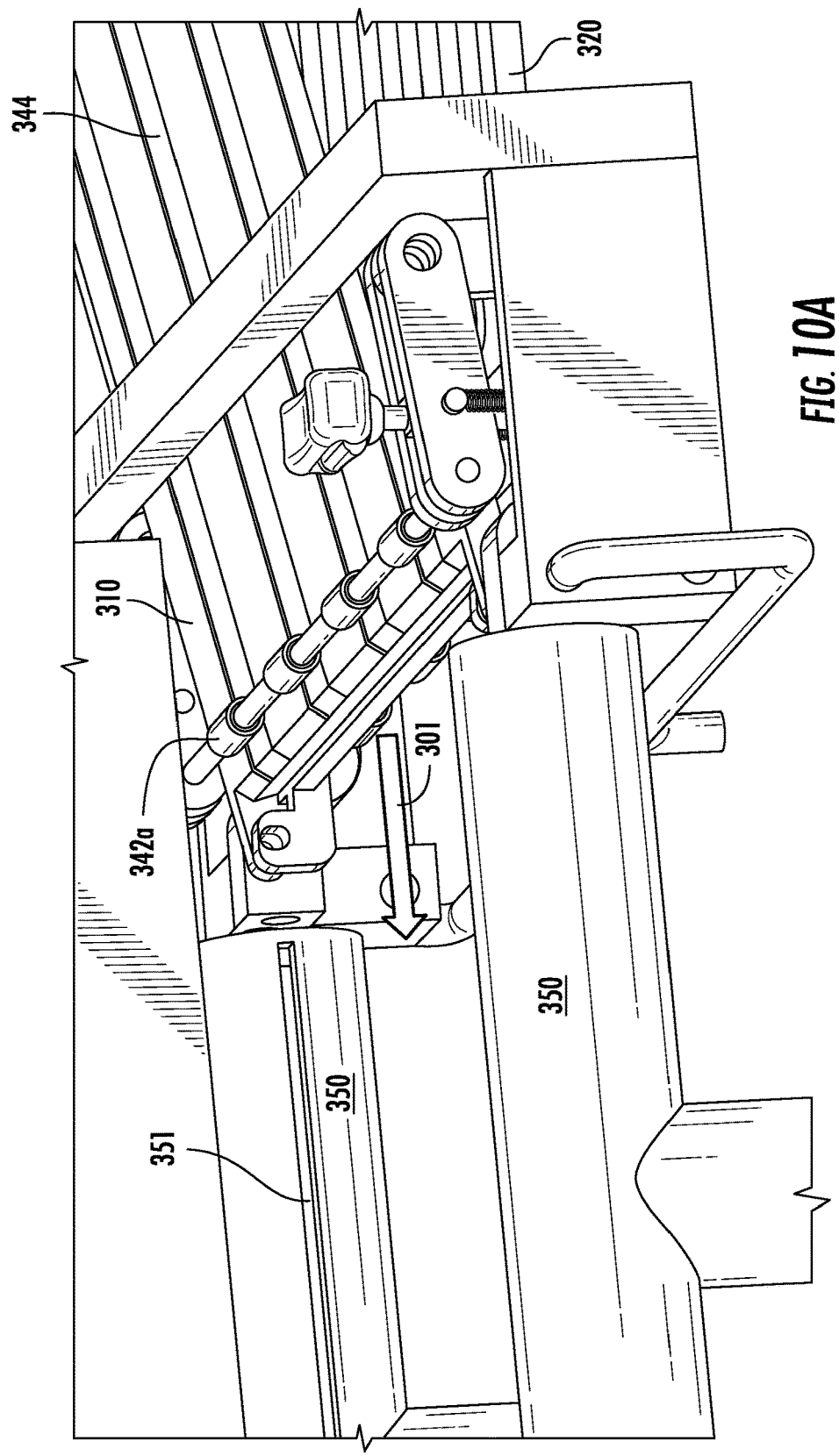
FIGS. 10A-10C show views of the bonding apparatus of FIG. 8 in various stages of operation.
Figure 10C:
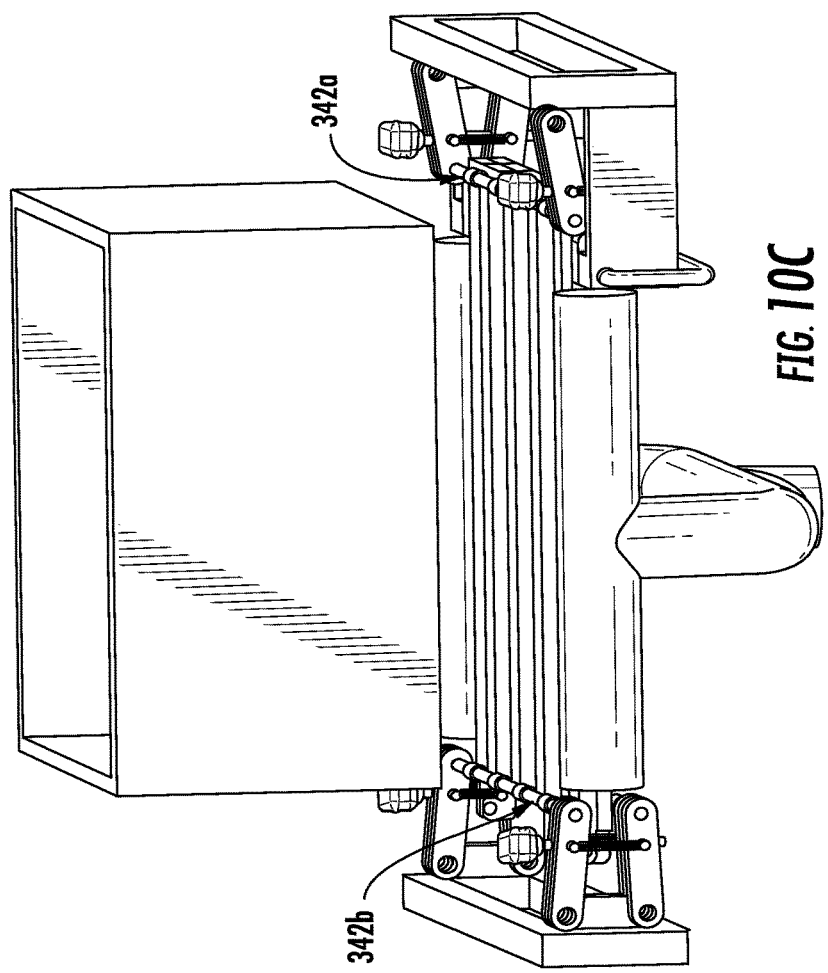
Figure 10B:
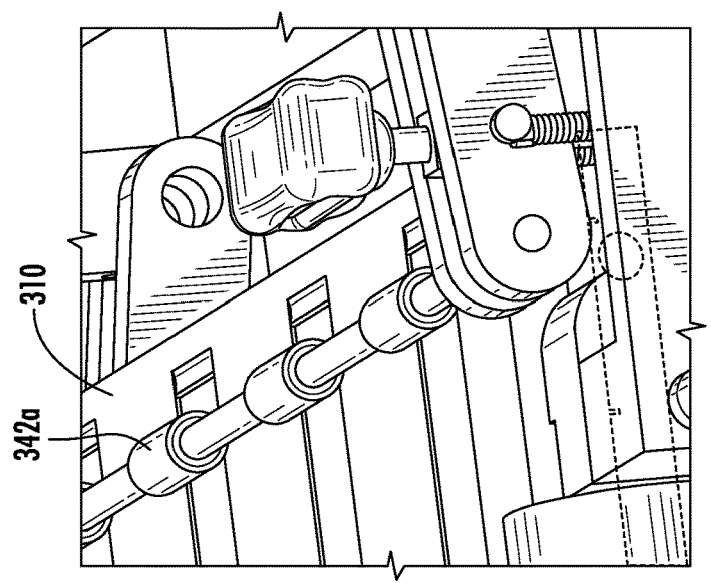

FIGS. 10A-10C show stages of the first plate 310 being loaded into the actuation mechanism 340 of bonding apparatus 300. FIG. 10A is a close-up perspective view, in which the left edge of the plates 310 and 320 are initially inserted into the actuation mechanism 340 and are still in the open position. As the plates 310 and 320 are inserted into the apparatus 300 as indicated by arrow 301, the rollers of pinch roller 342*a* traverse roller guides 344 to align the clamshell and add spring force to close the plate assembly. FIG. 10A also shows a venting slot 351 in exhaust 350, which shall be described subsequently in relation to FIGS. 11A-11D. In FIG. 10B the plates have been fully inserted as seen by the right edge of the plate 310 being horizontal and closed by pinch roller 342*a*. FIG. 10C provides a full perspective view of the assembly, where plates 310 and 320 are in the closed position, being held closed by pinch rollers 342*a* and 342*b* (with corresponding rollers on the underside, not seen in this view). Note that the left pinch roller assembly 342*b* also forces the lid (i.e., first plate 310) to close, adding more clamping force to the assembly.

Figure 11B:
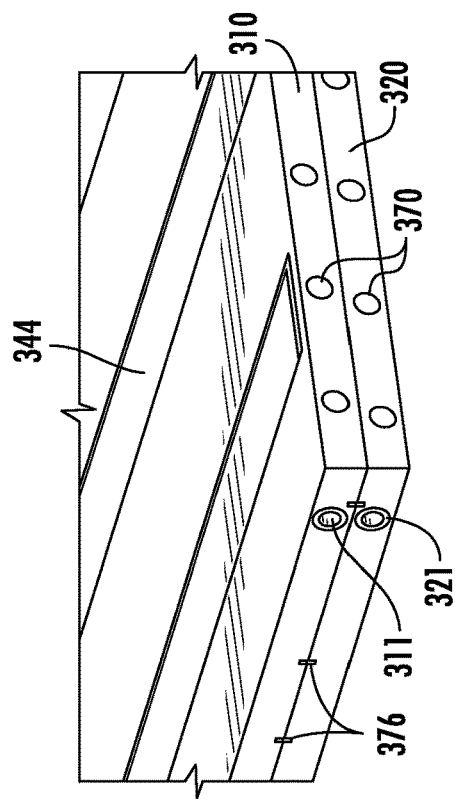
FIGS. 11A-11B are detailed top and perspective views, respectively, of the heating plates of FIG. 8.
Figure 11A:
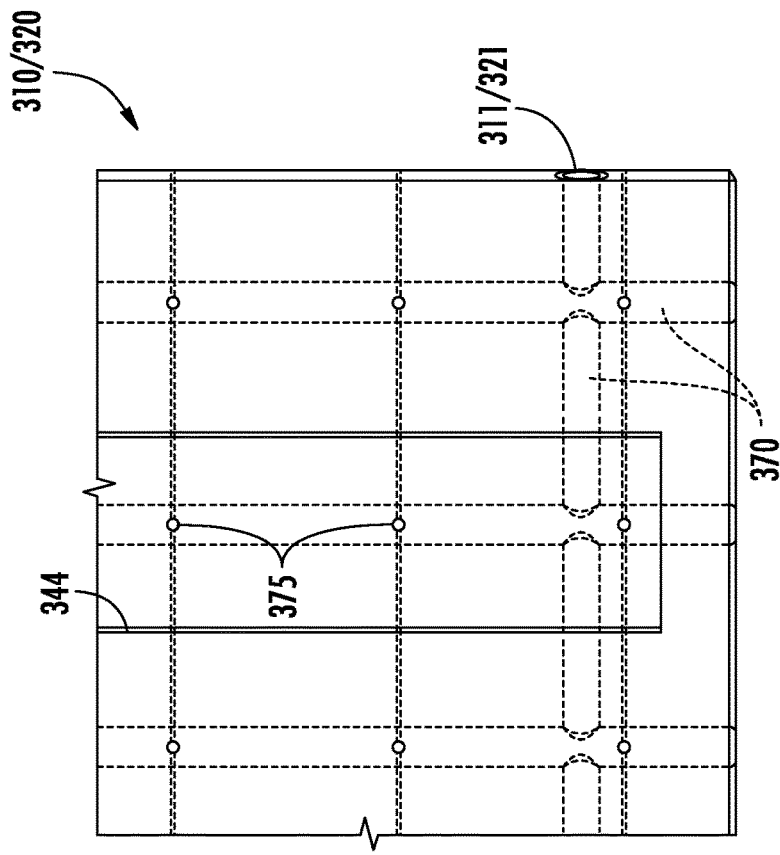

FIGS. 11A-11B illustrate two views of first and second plates 310 and 320, in an embodiment in which gas flow is utilized both as a heat source as well as to assist in the soldering process. FIG. 11A shows a top view wireframe of a corner portion of plate 310 or 320, and FIG. 11B shows a perspective view of plates 310 and 320 stacked together. As shown in FIG. 11A, the plates 310 and 320 in this embodiment have internal flow conduits 370 that terminate at O-ring seals 311/321. The flow conduits 370 are illustrated as a network of cylindrical, perpendicularly intersecting tubes, although other shapes and layouts are possible. The conduits 370 include holes 375 along their length, on the interior surface of the plates 310/320 (the surfaces that face the solar cell).

Gas, such as air, is introduced from a gas source, and flows through slide seals 352 (FIG. 8) and O-ring seals 311/321 into conduits 370. Air is forced from conduits 370 through holes 375 in the hinged plates 310 and 320. Thus, the gas source is fluidly coupled to the first plate and the second plate, and the flow conduits 370 are configured to deliver gas from the gas source to the solar cell when the first plate is in the closed position. In this embodiment, first and second plates 310 and 320 are made of thermally conductive material such as copper, to achieve a substantially uniform temperature across the surface of the plates. The air carries flux vapor away through slits 376, and venting slots 351 in the exhaust 350 (FIG. 10B) evacuates vapor from the assembly. Air flowing through the conduits 370 is heated by the heat source 330 and will also aid in the even application of heat to the solder joints on the solar cell. The air in the second (lower) plate 320 can be used in the cooling of the lower plate 320 if needed, where the temperature of the second plate 320 can be controlled by, for example, the gas flow rate through the conduits 370. The gas flows through the plates 310 and 320 during the whole attach process, and can also be used to cool the bonding apparatus 100 after the process is completed.

Figure 12A:
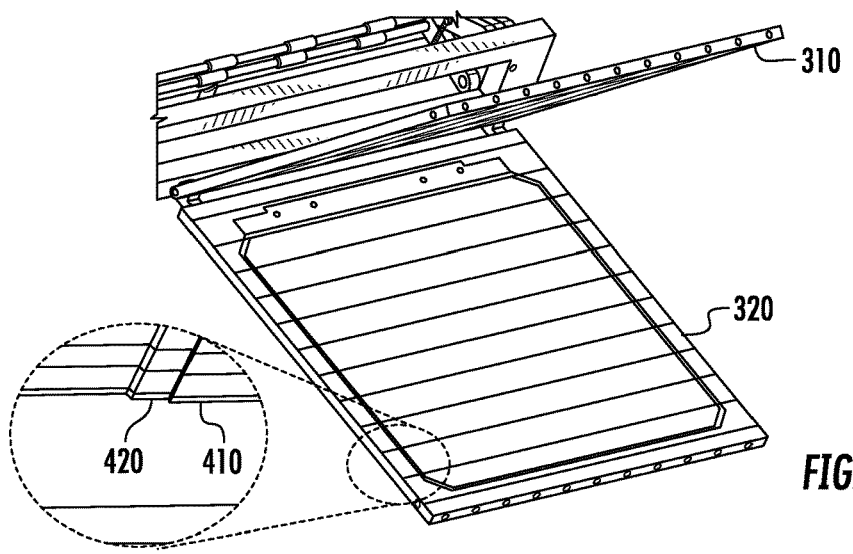
FIGS. 12A-12C show perspective and detailed views of alignment features, in accordance with some embodiments.
Figure 12B:
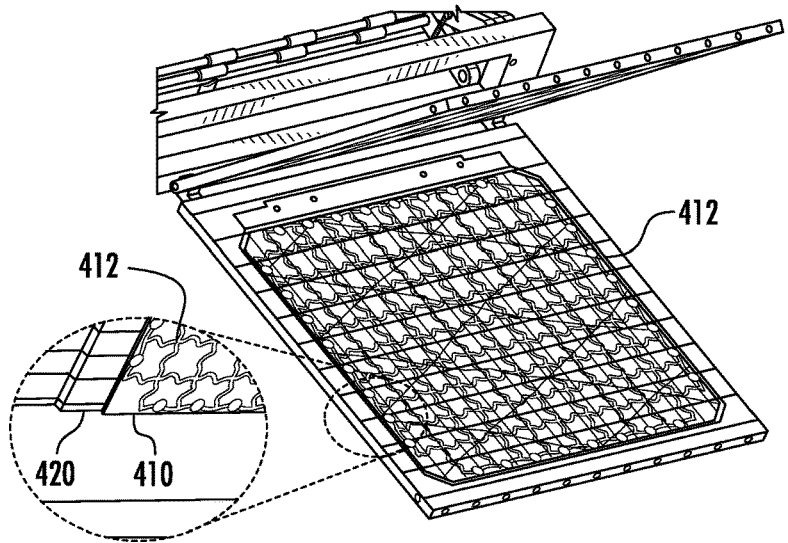
Figure 12C:
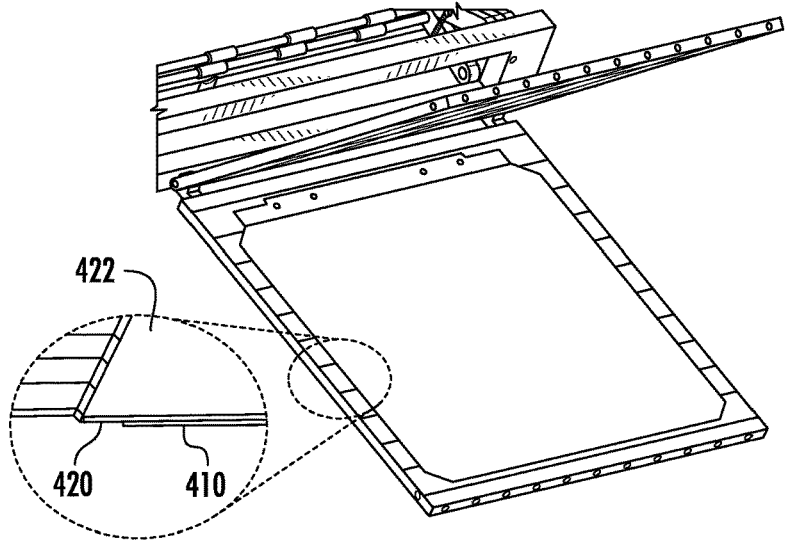

FIGS. 12A-12C and 13A-13C show embodiments of alignment fixtures that may be used with the bonding apparatuses disclosed herein, where the inset drawings are close-up cross-sectional views. FIG. 12A demonstrates the lower plate 320 having alignment pockets, which are recessed areas shaped for the solar cell components. The inset drawing of FIG. 12A shows stepped areas that correspond to alignment pockets 410 and 420. Pocket 420 is formed around pocket 410. In FIG. 12B, a back metallization element 412 has been placed into pocket 410, and in FIG. 12C a semiconductor wafer 422 has been placed in pocket 420, over the back metallization element 412. Thus, pockets 410 and 420 align the back metallization element 412 with the wafer 422, which is important so that specific soldering areas of the solar cell components are properly bonded together.

Figure 13A:
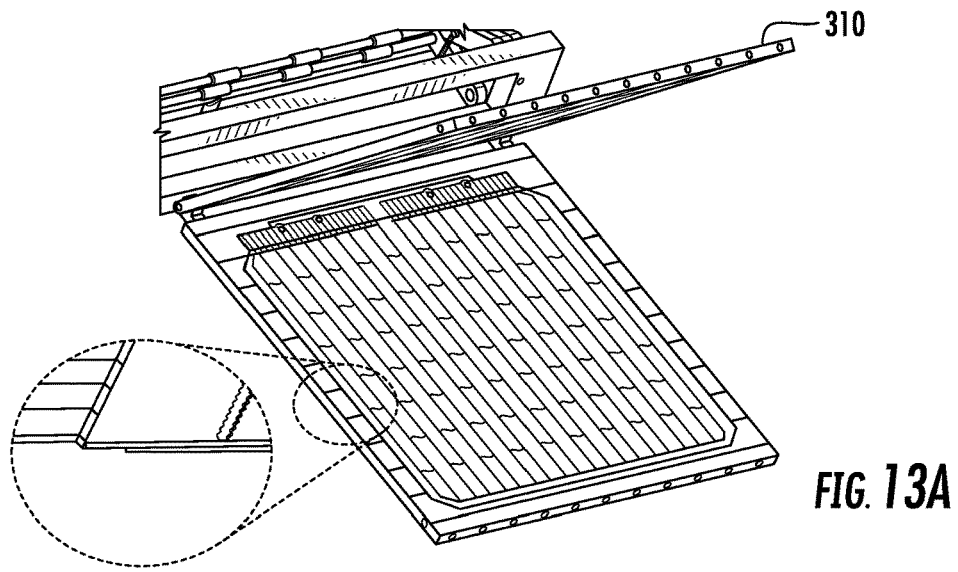
FIGS. 13A-13C show perspective and detailed views of additional alignment features, in accordance with some embodiments.
Figure 13B:
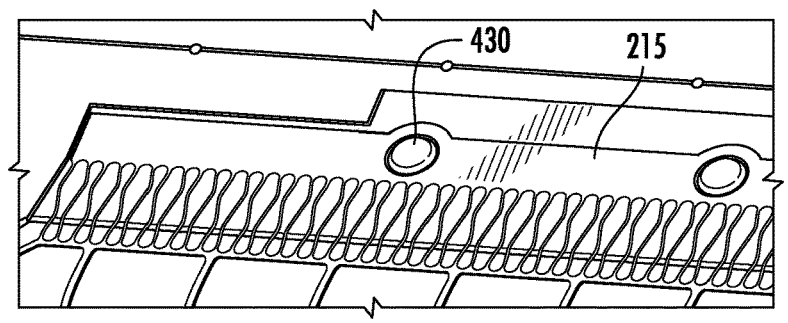
Figure 13C:
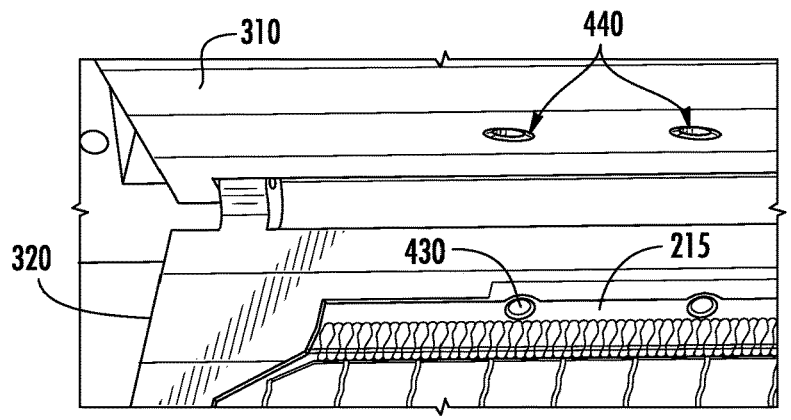

FIG. 13A shows a front metallization element being placed into the bonding apparatus, using further alignment fixtures. In FIG. 13B, pins 430 are incorporated into second plate 320, which serve as alignment features for the front metallization element. The front metallization element is fabricated with apertures in the interconnect element 215, into which pins 430 are inserted. Pins 430 have corresponding interference pockets 440 in the first plate 310 to assist in securing the front metallization element in the bonding apparatus.

The alignment features of FIGS. 12A-12C and 13A-13C may be machined into the plates of the bonding apparatus, or manufactured as separate components and assembled into the apparatus. In some embodiments, the alignment fixtures may be removable, so that the bonding apparatus can be interchangeably configured for different solar cell sizes or arrays.

Figure 14:
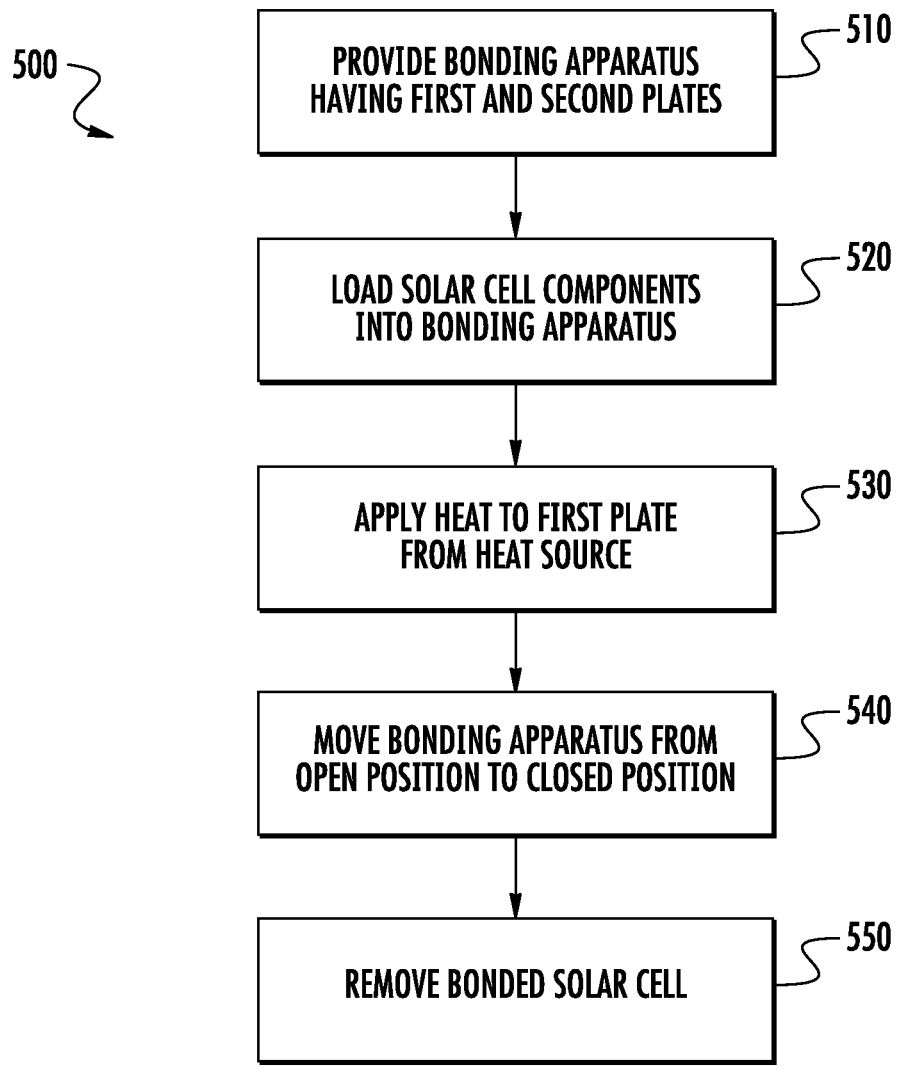
FIG. 14 is a flowchart of a method for bonding metallization elements onto a solar cell using the bonding apparatuses of the present disclosure.

FIG. 14 is an embodiment of a flowchart 500 for bonding metallization elements on a solar cell using bonding apparatuses of the present disclosure. In step 510, a bonding apparatus is provided, the bonding apparatus having first and second plates. The first and second plates are sized to cover an entire solar cell. In an open position, the first plate and the second plate are apart, and in a closed position the first plate and the second plate contact opposite surfaces of the solar cell. In step 520, solar cell components are loaded into the bonding apparatus. The solar cell components include a front metallization element, a semiconductor wafer, and a back metallization element. The metallization elements may be conventional ribbons or may be unitary metallic articles that provide metallization over the entire surface of the semiconductor wafer. The metallic article may include a cell-to-cell interconnection element.

In step 530, a heat source applies heat to the first plate. In some embodiments, the second plate may also include its own heat source. As the first plate becomes heated, the heat radiating from the first plate causes solder on the metallization elements to begin to melt. The bonding apparatus is then moved from the open position to the closed position in step 540, such as by moving the first plate toward the second plate. In the closed position, the entire solar cell is bonded together in a single a process that applies heat and pressure over a desired time period to both the front and back metallizations. The first plate and the second plate are configured to apply a force to the solar cell to achieve controlled solder reflow, where the amount of force at a first end of the solar cell is different from the force at a second end of the solar cell when the bonding apparatus is in or moving to the closed position. In some embodiments, the amount of force decreases from the first end of the solar cell to the second end of the solar cell. In some embodiments, the first plate is non-parallel to the second plate. The non-parallel alignment of the plates assists in promoting uniform solder flow across the solar cell. In the closed position, the plates are parallel and directly contact the solar cell. In other embodiments, the force applied by the bonding apparatus across the cell may be created by a plurality of biasing elements with varying biasing forces, or a compressible block with a density gradient.

The first plate and the second plate are configured to operate at different temperatures from each other when in the closed position. For example, the second plate may be configured to dissipate heat such that the second plate has a lower temperature than the first plate when the first plate is in the closed position. The first plate and second plate are configured to have uniform temperatures on the surfaces that are contacting the solar cell. Furthermore, the temperatures of the first plate and the second plate may be tailored to accommodate the specific types of solder used for the metallization elements. In some embodiments, the second plate may utilize multiple layers of materials to dissipate heat, such as a mesh positioned between a substrate and a thermally conductive sheet. In some embodiments, the first and/or second plates may use gas flow such as air to control the temperature of the plates. In step 550, the bonded solder cell is removed from the bonding apparatus.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A bonding apparatus comprising:
a heat source;
a first plate coupled to the heat source, the first plate being thermally conductive and configured to cover an entire solar cell;
a second plate, the second plate being thermally conductive and configured to cover the entire solar cell; and
an actuation mechanism configured to move the bonding apparatus between an open position and a closed position, wherein in the open position the first plate and the second plate are apart, and in the closed position the first plate and the second plate contact opposite surfaces of the solar cell;
wherein the second plate is configured to dissipate heat such that the second plate has a lower temperature than the first plate when the bonding apparatus is in the closed position; and
wherein the first plate and the second plate are configured to apply a force to the solar cell, the force at a first end of the solar cell being different than the force at a second end of the solar cell when the bonding apparatus is in or moving to the closed position.

2. The bonding apparatus of claim 1, wherein the first plate and the second plate are non-parallel to each other when the actuation mechanism moves the bonding apparatus from the open position to the closed position.

3. The bonding apparatus of claim 1, wherein at least one of the first plate or the second plate comprises a plurality of biasing elements, wherein a first biasing element in the plurality of biasing elements has a first biasing force that is higher than a second biasing force of a second biasing element in the plurality of biasing elements.

4. The bonding apparatus of claim 1, wherein at least one of the first plate or the second plate comprises a compressible block having a density gradient across a length of the compressible block.

5. The bonding apparatus of claim 1, wherein the force decreases from the first end to the second end of the solar cell.

6. The bonding apparatus of claim 1, wherein:
the first plate has a first contacting surface and the second plate has a second contacting surface, the first contacting surface and the second contacting surface contacting the opposite surfaces of the solar cell in the closed position;
the first contacting surface is configured to operate at a first uniform temperature across the first contacting surface; and
the second contacting surface is configured to operate at a second uniform temperature across the second contacting surface.

7. The bonding apparatus of claim 1, wherein the second plate comprises:
a substrate;
a mesh coupled to the substrate; and
a thermally conductive sheet coupled to the mesh, wherein the thermally conductive sheet is oriented toward the solar cell.

8. The bonding apparatus of claim 1, further comprising a gas source fluidly coupled to the first plate and the second plate;
wherein the first plate and the second plate each comprise flow conduits configured to deliver gas from the gas source to the solar cell when the first plate is in the closed position.

9. A bonding apparatus comprising:
a heat source;
a first plate coupled to the heat source, the first plate being thermally conductive and configured to cover an entire solar cell;
a second plate, the second plate being thermally conductive and configured to cover the entire solar cell; and
an actuation mechanism configured to move the bonding apparatus between an open position and a closed position, wherein in the open position the first plate and the second plate are apart, and in the closed position the first plate and the second plate contact opposite surfaces of the solar cell;
wherein the first plate and the second plate are configured to operate at different temperatures from each other when in the closed position; and
wherein the first plate and the second plate are configured to apply a force to the solar cell, the force at a first end of the solar cell being different than the force at a second end of the solar cell when the bonding apparatus is in or moving to the closed position.

10. The bonding apparatus of claim 9, wherein the first plate and the second plate are non-parallel to each other when the actuation mechanism moves the bonding apparatus from the open position to the closed position.

11. The bonding apparatus of claim 9, wherein at least one of the first plate or the second plate comprises a plurality of biasing elements, wherein a first biasing element in the plurality of biasing elements has a first biasing force that is higher than a second biasing force of a second biasing element in the plurality of biasing elements.

12. The bonding apparatus of claim 9, wherein at least one of the first plate or the second plate comprises a compressible block having a density gradient across a length of the compressible block.

13. The bonding apparatus of claim 9, wherein the force decreases from the first end to the second end of the solar cell.

14. The bonding apparatus of claim 9, further comprising a second heat source coupled to the second plate.

15. The bonding apparatus of claim 9, wherein:
the first plate has a first contacting surface and the second plate has a second contacting surface, the first contacting surface and the second contacting surface contacting the opposite surfaces of the solar cell in the closed position;
the first contacting surface is configured to operate at a first uniform temperature across the first contacting surface; and
the second contacting surface is configured to operate at a second uniform temperature across the second contacting surface.

16. The bonding apparatus of claim 9, wherein the second plate comprises:
a substrate;
a mesh coupled to the substrate; and
a thermally conductive sheet coupled to the mesh, wherein the thermally conductive sheet is oriented toward the solar cell.

17. A bonding apparatus comprising:
a heat source;
a first plate coupled to the heat source, the first plate being thermally conductive and configured to cover an entire solar cell;
a second plate, the second plate being thermally conductive and configured to cover the entire solar cell; and
an actuation mechanism configured to move the bonding apparatus between an open position and a closed position, wherein in the open position the first plate and the second plate are apart, and in the closed position the first plate and the second plate contact opposite surfaces of the solar cell;
wherein the second plate is configured to dissipate heat such that the second plate has a lower temperature than the first plate when the first plate is in the closed position; and
wherein the first plate and the second plate are configured to apply a higher force at a first end of the solar cell than at a second end of the solar cell when the bonding apparatus is in or moving to the closed position.

18. The bonding apparatus of claim 17, wherein the first plate and the second plate are non-parallel to each other when the actuation mechanism moves the bonding apparatus from the open position to the closed position, the first plate being closer to the second plate near the first end of the solar cell.

19. The bonding apparatus of claim 17, wherein at least one of the first plate or the second plate comprises a plurality of biasing elements, wherein a first biasing element in the plurality of biasing elements near the first end of the solar cell has a first biasing force that is higher than a second biasing force of a second biasing element in the plurality of biasing elements near the second end of the solar cell.

20. The bonding apparatus of claim 17, wherein at least one of the first plate or the second plate comprises a compressible block has a first density near the first end of the solar cell that is higher than a second density near the second end of the solar cell.

21. The bonding apparatus of claim 1, wherein a solder on a front side of the solar cell and a solder on a back side of the solar cell flow toward the second end of the solar cell when the bonding apparatus is moving to the closed position.

22. The bonding apparatus of claim 1, wherein the heat source is an infrared heat source.

23. The bonding apparatus of claim 9, wherein the heat source is an infrared heat source.

24. The bonding apparatus of claim 17, wherein the heat source is an infrared heat source.

* * * * *